United States Patent [19]

Oae et al.

[11] Patent Number: 5,364,718
[45] Date of Patent: Nov. 15, 1994

[54] METHOD OF EXPOSING PATTTERN OF SEMICONDUCTOR DEVICES AND STENCIL MASK FOR CARRYING OUT SAME

[75] Inventors: Yoshihisa Oae, Kawasaki; Kiichi Sakamoto, Tokyo, both of Japan

[73] Assignee: Fujitsu Limited, Kawasaki, Japan

[21] Appl. No.: 57,017

[22] Filed: May 5, 1993

Related U.S. Application Data

[63] Continuation of Ser. No. 814,227, Dec. 23, 1991, abandoned, which is a continuation of Ser. No. 403,385, Sep. 6, 1989, abandoned.

[30] Foreign Application Priority Data

Sep. 6, 1988 [JP] Japan ................... 63-222981

[51] Int. Cl.⁵ .................................. G03F 9/00
[52] U.S. Cl. .................................. 430/5; 430/22; 430/311; 430/394; 430/269
[58] Field of Search .......... 430/5, 22, 311, 394, 430/269

[56] References Cited

U.S. PATENT DOCUMENTS

| | | | |
|---|---|---|---|
| 4,181,860 | 1/1980 | Sumi | 250/492 A |
| 4,591,540 | 5/1986 | Bohlen et al. | 430/22 |
| 4,895,780 | 1/1990 | Nissan-Cohen et al. | 430/5 |

FOREIGN PATENT DOCUMENTS

| | | | |
|---|---|---|---|
| 0088727 | 6/1982 | Japan | 430/22 |
| 0046025 | 3/1986 | Japan | 430/22 |
| 206824 | 9/1987 | Japan | 430/5 |
| 62-206829 | 9/1987 | Japan . | |
| 0206829 | 9/1987 | Japan | 430/5 |
| 63-18352(A) | 6/1988 | Japan . | |

OTHER PUBLICATIONS

Sze, S. M., *VLSI Technology*, Section 7.4.3 on pp. 284–286, Bell Laboratories, 1983.

*Primary Examiner*—Thomas R. Neville
*Attorney, Agent, or Firm*—Staas & Halsey

[57] ABSTRACT

A method is provided for exposing a semiconductor device pattern onto a semiconductor substrate by repeatedly exposing an adjoining arrangement of a plurality of unit patterns. The device pattern is first divided into a plurality of unit patterns. Then, a stencil mask is provided with transmitting openings having shapes conforming to the respective unit patterns. Pattern lines on the stencil mask of the unit patterns which are to be connected with each other have at least one connecting end provided with at least one protrusion having a width less than that of the corresponding pattern lines. The protrusion on the connecting end reduces errors such as interruptions or excessive broadening in an exposed pattern line due to misalignment. Also disclosed is a stencil mask for carrying out the present inventive method.

8 Claims, 6 Drawing Sheets

(a0)  (a1)  (a2)

(b0)  (b1)  (b2)

(c0)  (c1)  (c2)

METHOD OF EXPOSING PATTERN OF SEMICONDUCTOR DEVICES AND STENCIL MASK FOR CARRYING OUT SAME

This application is a continuation of application Ser. No. 07/814,227, filed Dec. 23, 1991, now abandoned, which is a continuation of application Ser. No. 07/403,385 filed Sep. 6, 1989, now abandoned.

BACKGROUND OF THE INVENTION

1. Field of the Invention

The present invention relates to a method and a stencil mask for exposing patterns of semiconductor devices, more specifically, it relates to a pattern exposing method in which a design pattern of a device is divided into a plurality of unit patterns, which are then transferred onto a semiconductor substrate in an adjoining arrangement to be connected and complete an integral device pattern.

2. Description of the Related Art

Recent ultra-fine patterns such as in a 16 M DRAM (dynamic random access memory) have a fine line width and a fine line interval. The line width or interval (frequently referred to as "design rule") decreases as the memory capacity increases, for example, from 1 $\mu$m for 1 M DRAM to 0.7 $\mu$m for 4 M, 0.5 $\mu$m for 16 M, 0.2 $\mu$m for 64 M, and so on.

Since most of such an ultra-fine device pattern is generally composed of a plurality of repeat patterns, a stencil transfer exposure method is proposed, in which the portion of repeat patterns is divided into a plurality of corresponding unit patterns, transmitting openings having a shape defining a charged particle beam conforming to the respective unit patterns are disposed in a stencil mask, which is then placed in an optical arrangement, a transmitting opening is selected in accordance with the unit patterns to be exposed, the charged particle beam is irradiated through the selected opening to expose the selected unit pattern at the predetermined sites on a substrate, and irradiation or exposure of other unit patterns is repeated for other predetermined sites on the substrate in an adjoining relationship with each other to be connected with each other on the substrate and thereby complete the pattern of the portion of repeat patterns, the other portion of non-repeat patterns being exposed by using a variable rectangular beam.

In the stencil transfer exposure method, when unit patterns are exposed in an adjoining arrangement, a location error or displacement occurs at the connecting region of two adjoining unit patterns to significant extent due to the limited accuracy of positioning. Such a location error causes a problem in recent ultra-fine device patterns. For example, a transversal displacement between adjoining unit patterns as shown in FIG. 5 causes an excessively small width of pattern lines 51 and 52 at the connecting region as shown in FIG. 5, which will result in a connection failure, disconnection, or other defects. It is therefore necessary to take measures to prevent location errors while exposing unit patterns in an adjoining arrangement.

A method is proposed in Japanese Unexamined Patent Publication (Kokai) No. 62-206829, in which exposure is carried out such that the ends of pattern lines of two adjoining unit patterns are partially overlapped as shown in FIG. 4(a) of the publication.

This method, however, inevitably leads to an excessive broadening of the exposed pattern lines at the connecting region, since the connecting ends are exposed twice. This will cause a problem, particularly for recent ultra-fine patterns, in that an undesired connection could occur between two adjacent lines which must not be connected.

SUMMARY OF THE INVENTION

The object of the present invention is to provide a method and a stencil mask for exposing a semiconductor device pattern which ensures a reliable connection between the pattern lines of adjoining unit patterns while avoiding an excessive broadening of the exposed pattern lines at the connection region.

There is provided, according to the present invention, a method of exposing a semiconductor device pattern onto a semiconductor substrate by repeatedly exposing in an adjoining arrangement a plurality of unit patterns obtained by dividing at least part of a device pattern and connecting the unit patterns to complete said part of the device pattern on the substrate, which comprises:

dividing at least part of a device pattern into a plurality of unit patterns;

preparing a stencil mask provided with transmitting openings having shapes conforming to the respective unit patterns, pattern lines to be connected with each other bridging the adjoining unit patterns having at least one connecting end provided with at least one protrusion having a width less than that of the corresponding pattern lines;

placing the stencil mask in an optical arrangement for projecting the unit patterns onto the substrate;

irradiating a beam of charged particles or light through one of the openings for exposing one corresponding unit pattern onto the predetermined sites of the substrate; and repeating said irradiation through other openings for exposing the respective corresponding unit patterns onto the respective predetermined sites of the substrate until said part of the device pattern is completely transferred onto the substrate.

There is also provided, according to the present invention, a stencil mask used for exposing patterns of semiconductor devices onto a semiconductor substrate by repeatedly exposing in an adjoining arrangement a plurality of unit patterns obtained by dividing at least part of a device pattern, thereby connecting the unit patterns to complete said part of the device pattern on the substrate, which comprises:

a plate body having a plurality of openings disposed therein for transmitting a beam of charged particles or light therethrough, said openings having shapes conforming to the respective unit patterns, pattern lines to be connected bridging the adjoining unit patterns having at least one connecting end provided with at least one protrusion having a width less than that of the corresponding pattern lines.

To more easily effect a connection between pattern line ends under a given positioning accuracy, preferably one of a pair of pattern lines to be connected has a smooth connecting end and the other has a connecting end provided with at least one protrusion.

From the view point of manufacturing an ultra-fine pattern such that pattern lines have a width or a interval less than 1 $\mu$m, one protrusion should be provided on at least one of the pair of connecting ends.

In the present invention, the pattern line ends are partially exposed twice upon exposing the adjoining unit patterns. The protrusion provided at at least one of the connecting ends decreases the amount of irradiation beam energy introduced in the duplicately exposed region, in comparison with that introduced when both connecting ends are smooth. This enables an excessive broadening of the exposed lines at the connecting region to be avoided while ensuring a reliable connection between lines.

DESCRIPTION OF THE PREFERRED EMBODIMENT

FIG. 1 shows an exposure of a device pattern using unit patterns having one protrusion at one connecting end of a pattern line, the other end being smooth, according to the present invention.

Figure 1A:
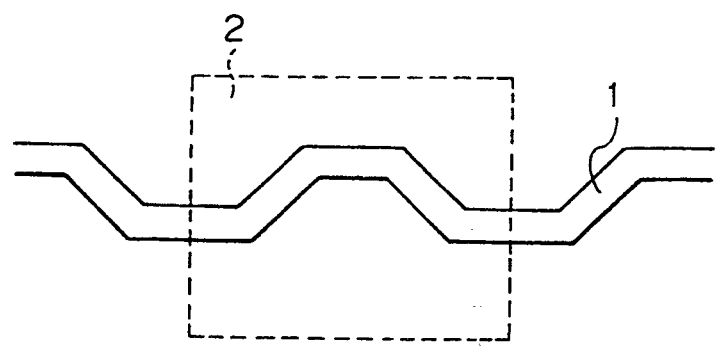
FIGS. 1(a)-(c) show an exposure of a device pattern using unit patterns having one protrusion at one connecting end of a pattern line, the other end being smooth, according to the present invention.
Figure 1B:
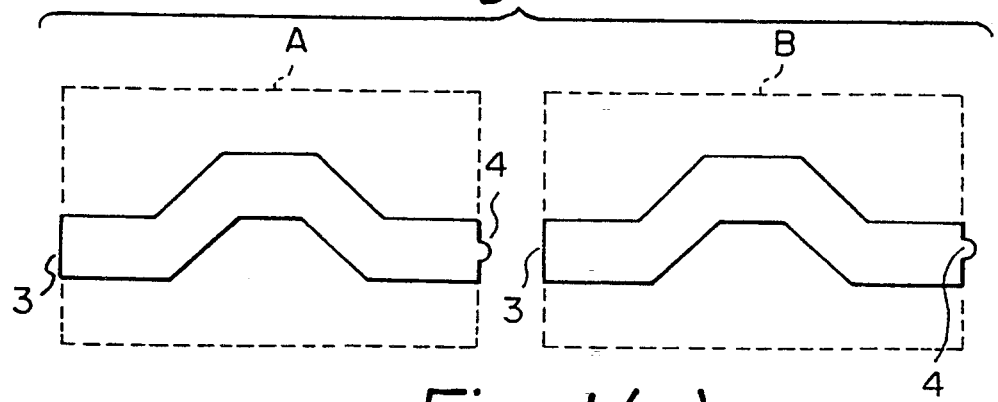
Figure 1C:
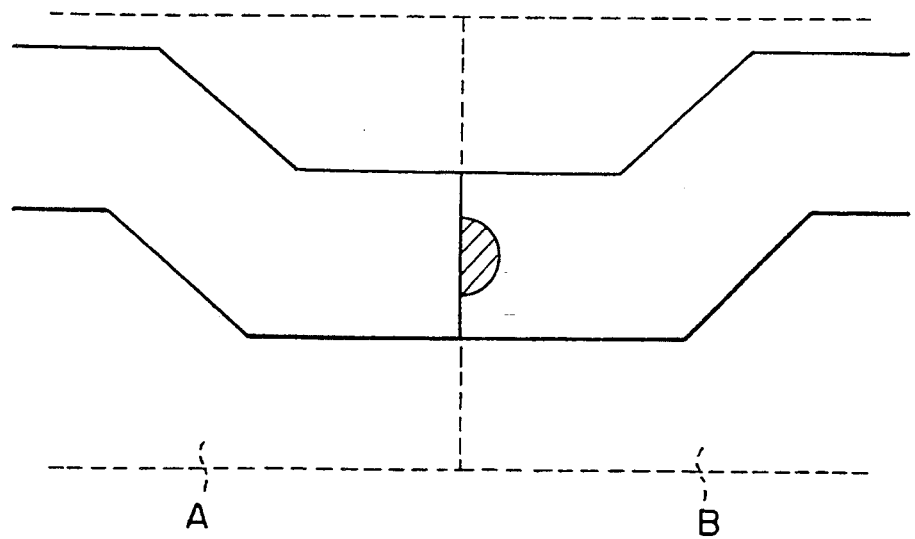
Figure 2A:
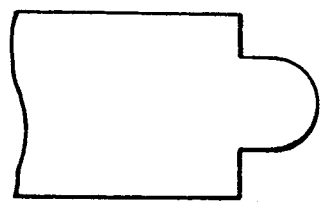
FIGS. 2(a)-(f) show other embodiments of the protrusion according to the present invention.
Figure 2D:
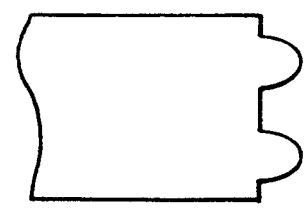
Figure 2B:
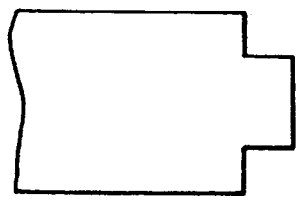
Figure 2E:
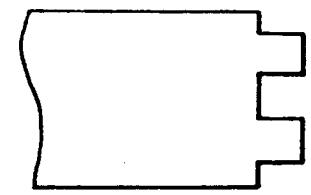
Figure 2C:
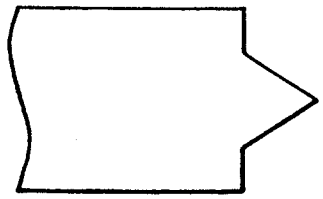
Figure 2F:
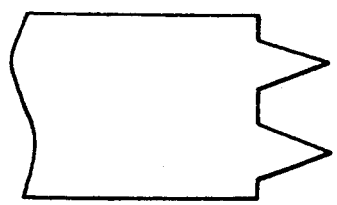

A design pattern 1 composed of repeat patterns 2 as shown in FIG. 1(a) is divided into a unit pattern conforming to the repeat pattern 2 as shown in FIG. 1(b) as two adjoining exposures A and B. A semicircular protrusion 4 having a diameter of half the width of the pattern line 1 is provided at one connecting end of the line 1. The other end 3 is smooth. When both ends 3 and 4 connected at the connecting region of two exposures A and B without displacement, only the hatched region 5 of FIG. 1(c) is exposed twice and no excessive broadening of the exposed lines occurs at the connecting region.

The protrusion may have any shape in addition to a semicircle, as shown in FIGS. 2(a) to (f).

FIG. 3 shows another embodiment of exposing a device pattern according to the present invention, in which both connecting ends have a protrusion.

Figure 3A:
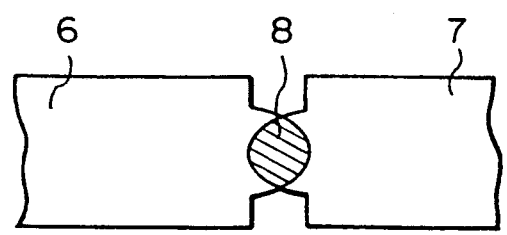
FIGS. 3(a)-(b) show another embodiment of exposing a device pattern according to the present invention, in which both connecting ends have a protrusion.
Figure 3B:
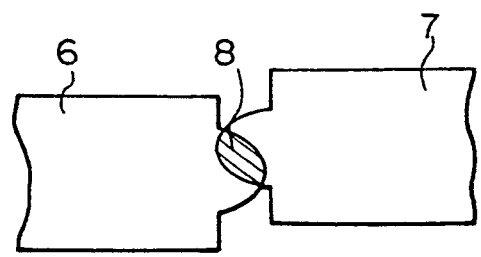

Pattern lines 6 and 7 of two adjoining unit patterns have a semicircular protrusion at both ends thereof and the unit patterns are exposed such that the protrusions are overlapped with each other. FIG. 3(a) shows the exposed pattern without displacement, and FIG. 3(b) shows one with a slight displacement. For both cases, the hatched region 8 is exposed twice to cause a broadening of the exposed pattern lines but the broadened line width cannot significantly exceed the designed line width, since the duplicately exposed region 8 has a width of one half of the line width or less.

The above embodiment will be described in more detail in comparison with the conventional method using a smooth connecting end.

Figure 6A:
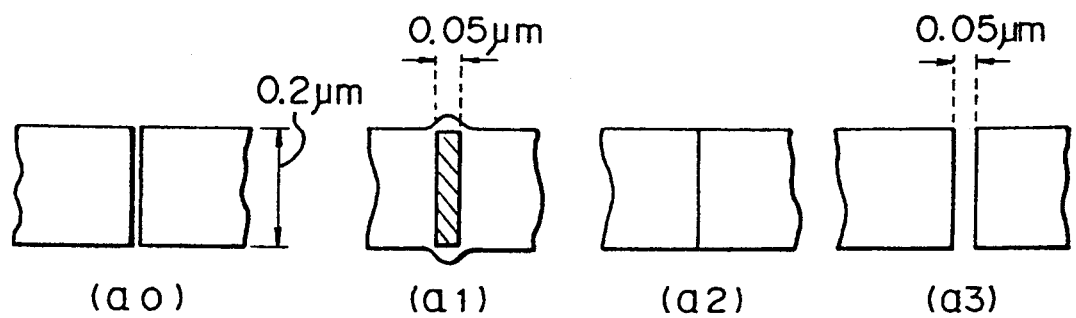
FIGS. 6(a)-(b) show the exposed ends of pattern lines to be connected under a longitudinal displacement condition for smooth connecting ends of the conventional method.
Figure 6B:
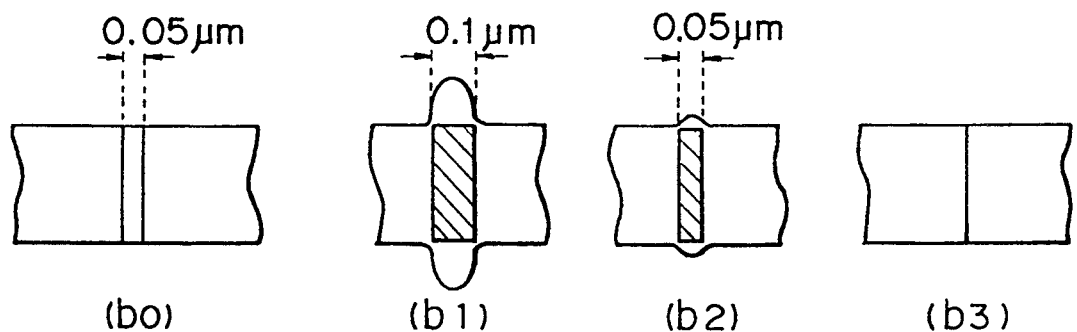
Figure 6C:
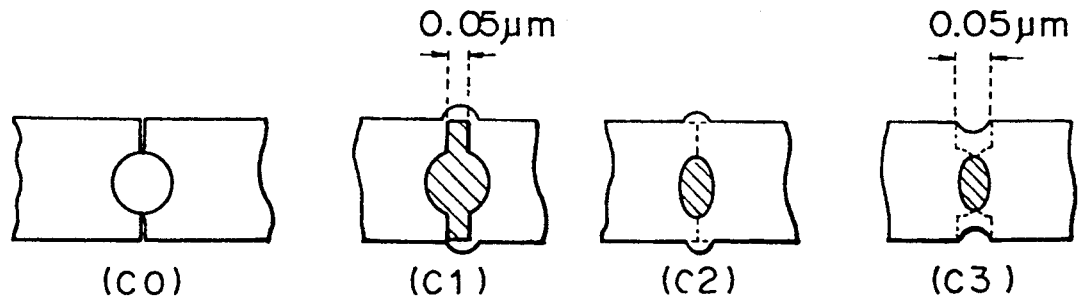
FIG. 6(c) shows protruded connecting ends according to the present invention.

Referring to FIG. 6, the exposed ends of pattern lines to be connected under a longitudinal displacement condition will be discussed. FIGS. 6(a) to (c) show the connection regions of the exposed patterns for the conventional method (a) and (b) and the above embodiment of the present invention (c). The line width is 0.2 82 m and the maximum displacement due to positioning accuracy is 0.05 $\mu$m for all cases (a) to (c).

FIG. 6(a) shows a case in which exposure is carried out under a preset positioning such that no overlapping occurs, i.e., the mating ends are just in contact with each other. When overlapping occurs due to an uncontrollable displacement, the connecting region is exposed twice over the entire width of pattern line and causes an excessive broadening of the exposed lines (a1). When no displacement occurs, a connection is established at the designed width (a2). When an uncontrollable displacement occurs in the separating direction, the line ends cannot be connected with each other, resulting in a disconnection of the device pattern (a3).

FIG. 6(b) shows a case in which exposure is carried out under a preset positioning such that overlapping occurs to an extent of 0.05 $\mu$m (b0). Overlapping due to an uncontrollable displacement (b1) will cause an excessive and more extensive broadening of the exposed lines than in the case (a). Even when no displacement occurs, the preset overlapping of 0.05 $\mu$m will occur, which results in an excessive broadening of the exposed line to the same extent as in the case (a1). When an uncontrollable displacement occurs in the separating direction, a connection is established at the designed width (b2).

FIG. 6(c) shows a case according to the present invention. Neither an excessive broadening of the exposed lines as in the case (b) due to an uncontrollable displacement in the overlapping direction, nor a disconnection as in the case (a) due to an uncontrollable displacement in the separating direction, occurs, and therefore, the present invention enables a highly reliable connection between pattern lines.

Referring to FIG. 7, the exposed ends of pattern lines to be connected under a transversal displacement condition will be discussed. The cases (a) to (c) of FIG. 7 are under similar conditions as for the cases (a) to (c) of FIG. 6, respectively, except for the displacement direction.

Figure 7A:
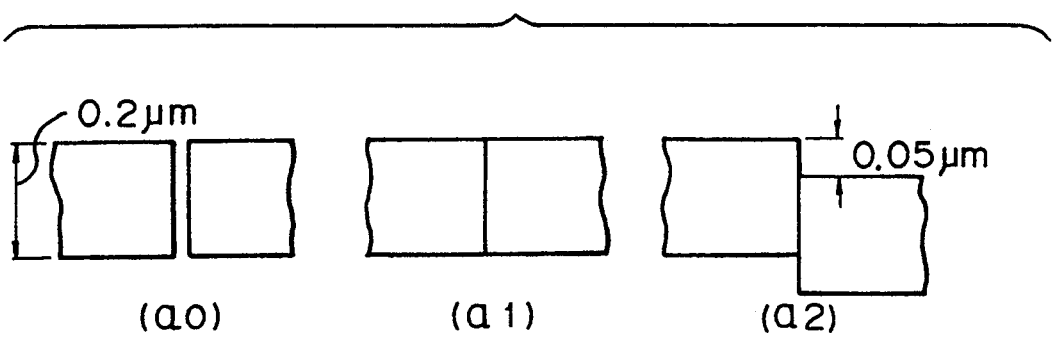
FIGS. 7(a)-(b) show the exposed ends of pattern lines to be connected under a transversal displacement condition for smooth connecting ends of the conventional method

FIG. 7(a) shows that a transversal displacement of 0.05 $\mu$m reduces the pattern line width from the design rule of 0.2 $\mu$m to an excessively small width of 0.1 $\mu$m.

Figure 7B:
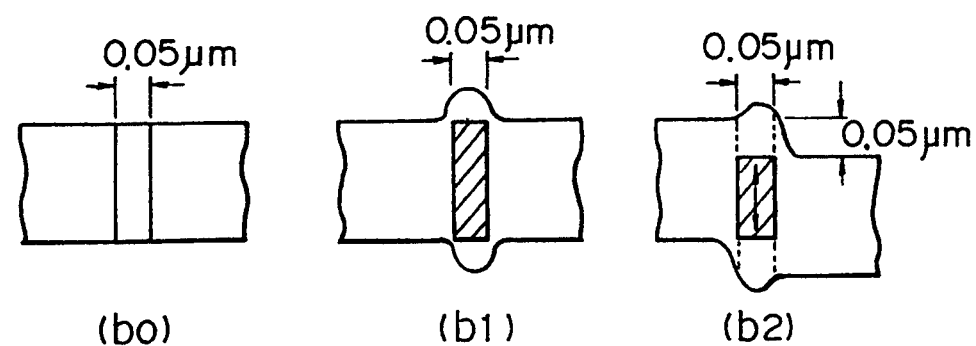

FIG. 7(b) shows that a transversal displacement reduces the area of duplicate exposure as shown by cross hatching (a2) in comparison with the area duplicately exposed with no displacement (a1), and the broadening of the exposed lines is also reduced but is still present. The duplicate exposure area, and, in turn, the degree of broadening, varies with the amount of displacement, i.e., the greater the displacement, the smaller the broadening and vice versa. Naturally, a greater displacement should result in a greater reduction of the line width, but the above relationship is contrary to this normally expected condition and provides an adverse effect in that both the broadening and the reduction of line width are undesirably accelerated.

Figure 7C:
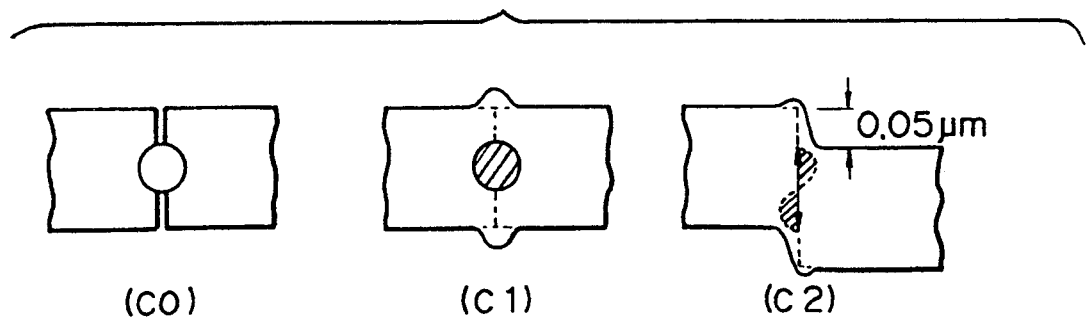
FIG. 7(c) shows protruded connecting ends according to the present invention.

FIG. 7(c) shows that an optimized shape of the protrusion can keep the duplicately exposed area unchanged under a given amount of displacement, as seen from the comparison between (c1) and (c2), which prevents the undesired variation of the area such as in (b). A displacement within the region in which the duplicate exposure region is present may cause broadening, but the degree of the broadening is reduced, since the distance from the line end is increased although the total area of duplicate exposure is unchanged. Additionally, for the region in which a reduction of line width will occur (shown with a double-headed arrow), a transverse displacement makes the duplicate exposure region closer to the line end and results in a greater broadening effect. This effect is also obtained in the case (b). Thus, the case (c) according to the present invention effectively prevents both the reduction of the line width as in the case (a) and the broadening as in the case (b).

As described above, the present invention effectively prevents an excessive broadening of the exposed pattern lines at the connecting region, in comparison with the conventional method, under a given degree of displacement, i.e., a given positioning accuracy.

Figure 4:
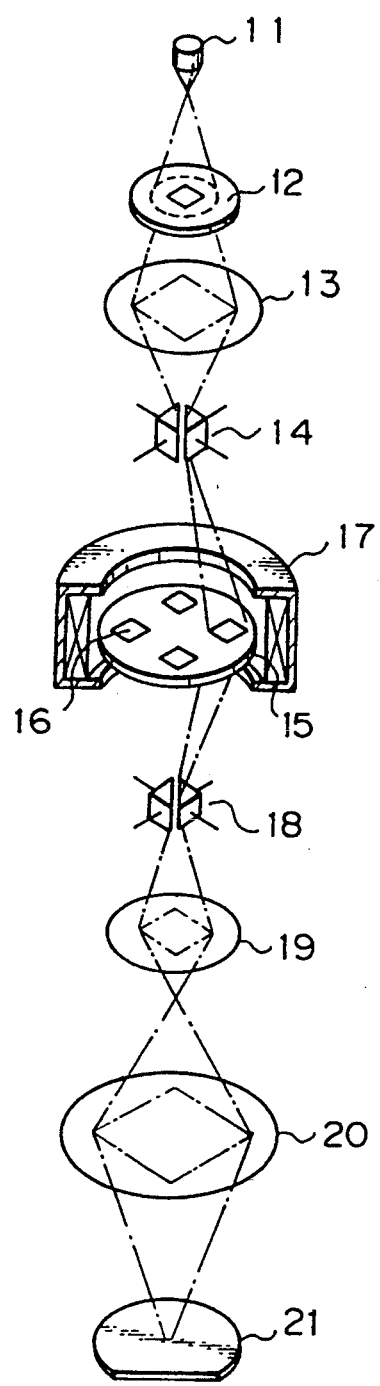
FIG. 4 shows a constitution of an electron beam exposure apparatus.
Figure 5:
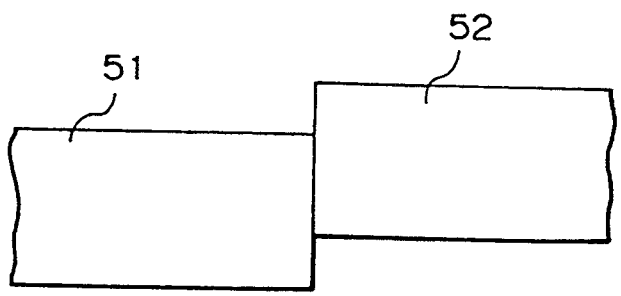
FIG. 5 shows transversal displacement in the conventional method.

An embodiment of pattern forming by using the method according to the present invention will be described, referring to FIG. 4 showing an assembly of an electron beam exposure apparatus.

An electron gun 11 disposed at the upper portion of the body tube evacuated to a high vacuum level irradiates an electron beam to a rectangular shaping aperture 12. The beam, which has been shaped rectangularly upon passing through the aperture 12, is converged by a lens 13 and reaches a deflection plate 14 for selecting a basic cell.

The thus deflected beam is irradiated to one of the basic cells 16 disposed on a stencil mask 15. The basic cells 16 have a transmitting opening for defining the irradiated beam in the shape conforming to a unit pattern having a pattern line provided with at least one protrusion having a width less than that of the corresponding pattern line at at least one connecting end thereof. The beam is shaped to the shape of the unit pattern upon passing through the selected transmitting opening while converged and deflected back to be aligned with the electron gun axis by a condenser lens 17 disposed around the stencil mask 15, and then enters the region surrounded by correction deflection plates 18.

After correction of the irradiation direction by the correction deflection plates 18, a beam having the shape of the unit pattern is projected through a first and a second reducing lenses 19 and 20 onto a wafer 21 coated with a photosensitive agent, which exposes and images the unit pattern on the wafer 21.

Figure 8:
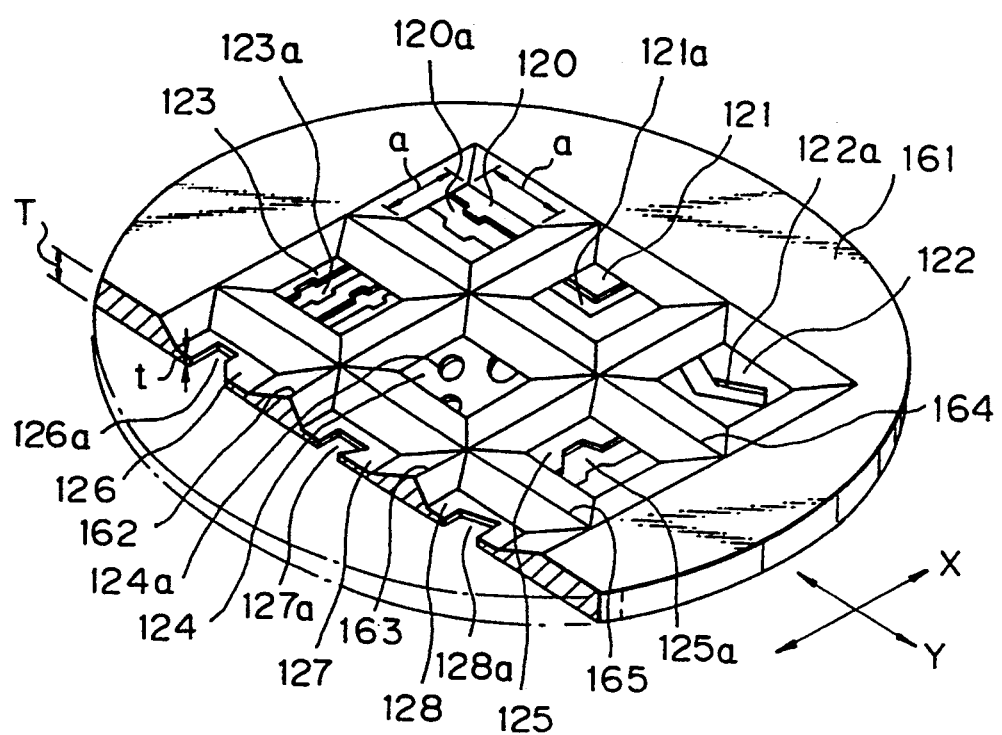
FIG. 8 shows an embodiment of the details of the stencil mask 15 of FIG. 4 in the upside-down position.

Referring to FIG. 8, a preferred embodiment of the stencil mask 15 is described in detail. The stencil mask 15 made of a silicon substrate having a thickness T of 400 to 500 μm has pattern regions 120 to 128 in which transmitting openings 120a to 128a having the shapes of the respective unit patterns are formed. Each of the pattern regions 120 to 128 is in the form of a square with an edge length of 500 μm and having a thickness of about 10 μm. Crosspieces 162 and 163 extending in the X-direction and crosspieces 164 and 165 extending in the Y-direction compose a lattice. The sections of the crosspieces 162 to 165 have the form of a triangle having a height H slightly lower than the thickness T. These crosspieces have a high mechanical strength and effectively serve as a heat path. The stencil mask 15 thus has a constitution such that the pattern regions 120 to 128 are surrounded by the crosspieces 162 to 165, respectively, to have a greater thickness at the periphery thereof.

The above constitution of the stencil mask 15 brings an advantage in that the pattern regions 120 to 128 are reinforced over the whole periphery thereof to prevent pattern failure by impact loading during handling. The crosspieces also prevent thermal damage of the pattern regions. For example, an electron beam is irradiated to the pattern region denoted by the numeral 124 for exposing a circular pattern. Heat generated in the pattern region 124 is transferred to the surrounding crosspieces 162 to 165 and then conducted through the crosspieces 162 to 165 toward the crosspiece 161 while released from the surface of the crosspieces 162 to 165. Therefore, little heat is accumulated in the pattern region 124 and there is no risk of heat-induced deformation or fusion of the pattern region 124. This prevents deformation or failure of the transmitting opening 124a, and the unit pattern defined by the opening 124a can be exposed at a high accuracy. The same effect is obtained for other pattern regions.

Thus, the above-described embodiment of the stencil mask applicable to carrying out the present inventive method has an improved mechanical strength and an excellent thermal resistance.

Although the above embodiment of the stencil mask 15 has crosspieces both in the directions X and Y, crosspieces may be provided either in the X or Y direction, which can bring an effect of improving the mechanical strength and the thermal resistance. The provision of crosspieces in one direction also has an advantage in that more pattern regions can be contained in the same area of a stencil mask in accordance with the space otherwise required for crosspieces.

By selecting one of the unit patterns and exposing in an adjoining arrangement the selected unit patterns in the manner as described above, a design pattern of semiconductor device can be transferred onto the wafer so that the pattern lines to be connected are reliably connected without excessive broadening of the exposed pattern lines at the connecting region between adjoining unit patterns.

As described above, the present invention uses a protrusion provided at the connecting end of pattern lines to prevent not only the excessive broadening of the exposed lines at the connecting region but also the disconnecting of device a pattern even under the condition of a possible displacement upon each of the unit pattern exposures.

Although the protrusion at the connecting ends can be adopted in the conventional method using a point beam or a variable beam, the resulting increase of the process control parameters will reduce the process throughput. In the present inventive method, in which the unit patterns selected from a stencil are transferred, the provision of a protrusion in the unit patterns of a stencil causes no increase of the process control parameters, and accordingly, no reduction of the throughput.

We claim:

1. A method of exposing a device pattern onto a semiconductor substrate by repeatedly exposing in an adjoining arrangement a plurality of unit patterns, thereby connecting pattern lines of the unit patterns to complete the device pattern on the substrate, said method comprising:

(a) dividing at least part of the device pattern into the plurality of unit patterns;

(b) preparing a stencil mask provided with transmitting openings having shapes respectively conforming to the unit patterns, wherein the pattern lines of the unit patterns which are to be connected with each other have at least one connecting end provided with at least one semicircular protrusion having a maximum width less than that of the corresponding pattern lines;

(c) placing the stencil mask in an optical arrangement for projecting the unit patterns onto the substrate;

(d) irradiating a beam of charged particles or light through one of the openings for exposing one corresponding unit pattern onto predetermined sites of the substrate; and (e) repeating said irradiation through other openings for exposing respective corresponding unit patterns onto respective predetermined sites of the substrate until the device pattern is completely transferred onto the substrate.

2. A stencil mask used for exposing patterns of semiconductor devices onto a semiconductor substrate by repeatedly exposing in an adjoining arrangement a plurality of unit patterns obtained by dividing at least part of a device pattern, thereby connecting pattern lines of the unit patterns to complete part of the device pattern on the substrate, comprising:

a plate body having a plurality of openings disposed therein for transmitting a beam of charged particles or light therethrough, the openings having shapes respectively conforming to the unit patterns, wherein the pattern lines of the unit patterns which are to be connected have at least one connecting end provided with at least one semicircular protrusion having a maximum width less than that of the corresponding pattern lines.

3. A method of exposing a device pattern onto a semiconductor substrate by repeatedly exposing in an adjoining arrangement a plurality of unit patterns, thereby connecting pattern lines of the unit patterns to complete the device pattern on the substrate, said method comprising:

(a) dividing at least part of the device pattern into the plurality of unit patterns;

(b) preparing a stencil mask provided with transmitting openings having shapes respectively conforming to the unit patterns, wherein each pair of the pattern lines of the unit patterns which are to be connected with each other has a first connecting end which is smooth and a second connecting end provided with at least one semicircular protrusion having a maximum width less than that of the first connecting end;

(c) placing the stencil mask in an optical arrangement for projecting the unit patterns onto the substrate;

(d) irradiating a beam of charged particles or light through one of the openings for exposing one corresponding unit pattern onto predetermined sites of the substrate; and (e) repeating said irradiation through other openings for exposing respective corresponding unit patterns onto respective predetermined sites of the substrate until the device pattern is completely transferred onto the substrate.

4. A stencil mask used for exposing patterns of semiconductor devices onto a semiconductor substrate by repeatedly exposing in an adjoining arrangement a plurality of unit patterns obtained by dividing at least part of a device pattern, thereby connecting pattern lines of the unit patterns to complete part of the device pattern on the substrate, comprising:

a plate body having a plurality of openings disposed therein for transmitting a beam of charged particles or light therethrough, the openings having shapes respectively conforming to the unit patterns, wherein each pair of the pattern lines of the unit patterns which are to be connected has a first connecting end which is smooth and a second connecting end provided with at least one semicircular protrusion having a maximum width less than the first connecting end.

5. A method of exposing a device pattern onto a semiconductor substrate by repeatedly exposing in an adjoining arrangement a plurality of unit patterns, thereby connecting pattern lines of the unit patterns to complete the device pattern on the substrate, said method comprising:

(a) dividing at least part of the device pattern into the plurality of unit patterns;

(b) preparing a stencil mask provided with transmitting openings having shapes respectively conforming to the unit patterns, wherein the pattern lines of the unit patterns which are to be connected with each other have at least one connecting end provided with at least one square protrusion having a maximum width less than that of the corresponding pattern lines;

(c) placing the stencil mask in an optical arrangement for projecting the unit patterns onto the substrate;

(d) irradiating a beam of charged particles or light through one of the openings for exposing one corresponding unit pattern onto predetermined sites of the substrate; and (e) repeating said irradiation through other openings for exposing respective corresponding unit patterns onto respective predetermined sites of the substrate until the device pattern is completely transferred onto the substrate.

6. A stencil mask used for exposing patterns of semiconductor devices onto a semiconductor substrate by repeatedly exposing in an adjoining arrangement a plurality of unit patterns obtained by dividing at least part of a device pattern, thereby connecting pattern lines of the unit patterns to complete part of the device pattern on the substrate, comprising:

a plate body having a plurality of openings disposed therein for transmitting a beam of charged particles or light therethrough, the openings having shapes respectively conforming to the unit patterns, wherein the pattern lines of the unit patterns which are to be connected have at least one connecting end provided with at least one square protrusion having a maximum width less than that of the corresponding pattern lines.

7. A method of exposing a device pattern onto a semiconductor substrate by repeatedly exposing in an adjoining arrangement a plurality of unit patterns, thereby connecting pattern lines of the unit patterns to complete the device pattern on the substrate, said method comprising:

(a) dividing at least part of the device pattern into the plurality of unit patterns;

(b) preparing a stencil mask provided with transmitting openings having shapes respectively conforming to the unit patterns, wherein the pattern lines of the unit patterns which are to be connected with each other have at least one connecting end provided with at least one pointed protrusion having a maximum width less than that of the corresponding pattern lines;

(c) placing the stencil mask in an optical arrangement for projecting the unit patterns onto the substrate;

(d) irradiating a beam of charged particles or light through one of the openings for exposing one corresponding unit pattern onto predetermined sites of the substrate; and (e) repeating said irradiation through other openings for exposing respective corresponding unit patterns onto respective predetermined sites of the substrate until the device pattern is completely transferred onto the substrate.

8. A stencil mask used for exposing patterns of semiconductor devices onto a semiconductor substrate by repeatedly exposing in an adjoining arrangement a plurality of unit patterns obtained by dividing at least part of a device pattern, thereby connecting pattern lines of the unit patterns to complete part of the device pattern on the substrate, comprising:

a plate body having a plurality of openings disposed therein for transmitting a beam of charged particles or light therethrough, the openings having shapes respectively conforming to the unit patterns, wherein the pattern lines of the unit patterns which are to be connected have at least one connecting end provided with at least one pointed protrusion having a maximum width less than that of the corresponding pattern lines.

* * * * *